United States Patent [19]

Fukai et al.

[11] Patent Number: 4,914,809

[45] Date of Patent: Apr. 10, 1990

[54] CHIP MOUNTING APPARATUS

[75] Inventors: Kikuji Fukai, Takasaki; Takahiro Tanaka, Maebashi; Makoto Mineno, Takasaki, all of Japan

[73] Assignee: Taiyo Yuden Co., Ltd., Tokyo, Japan

[21] Appl. No.: 307,899

[22] Filed: Feb. 7, 1989

[30] Foreign Application Priority Data

Feb. 15, 1988 [JP] Japan .................................. 63-18495
Apr. 28, 1988 [JP] Japan .................................. 63-108065

[51] Int. Cl.$^4$ ............................................. H05K 3/30
[52] U.S. Cl. ...................................... 29/740; 29/743; 29/759
[58] Field of Search ................ 29/740, 741, 739, 743, 29/759, 840, 834, 836; 294/2, 64.1

[56] References Cited

U.S. PATENT DOCUMENTS

| | | | |
|---|---|---|---|
| 3,963,456 | 6/1976 | Tsuchiya et al. | 29/739 |
| 4,375,126 | 3/1983 | Dull et al. | 29/740 |
| 4,451,324 | 5/1984 | Ichikawa et al. | 29/740 X |

Primary Examiner—Carl E. Hall
Attorney, Agent, or Firm—Woodcock, Washburn, Kurtz, Mackiewica & Norris

[57] ABSTRACT

An apparatus featuring a suction head assembly for transferring a set of chips from a template assembly to a printed circuit board. In order to make the suction head assembly readily adaptable for mounting the chips in any of numerous different arrangements on circuit boards, a planar head carrier is provided which has a multiplicity of mounting holes formed therein in columns and rows. A set of suction heads can be mounted to the head carrier in any desired arrangement, corresponding to the desired chip arrangement on the circuit board, by having their holders removably engaged in selected ones of the array of mounting holes in the head carrier. The template assembly is likewise made adaptable for a variety of chip arrangements, by having a set of open-top positioning vessels removably engaged in selected ones of an array of mounting holes formed in a template.

26 Claims, 7 Drawing Sheets

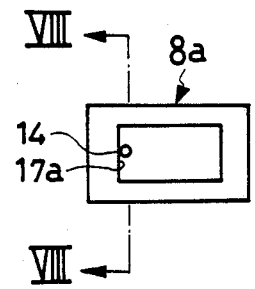
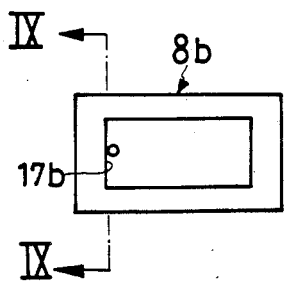
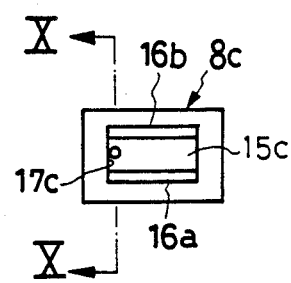
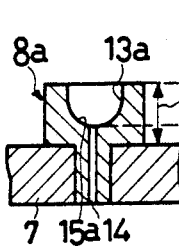
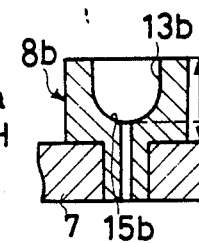
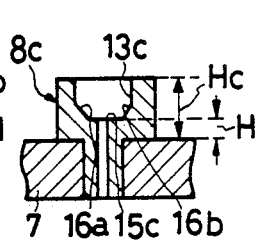
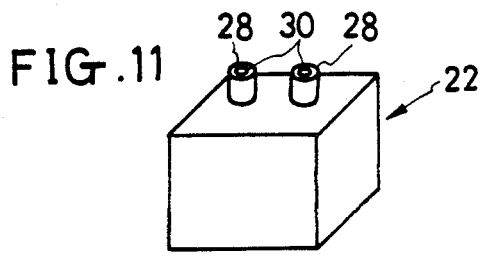

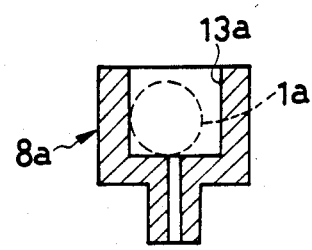
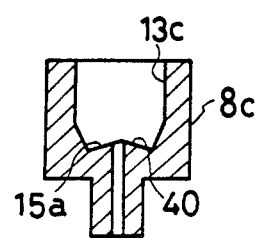
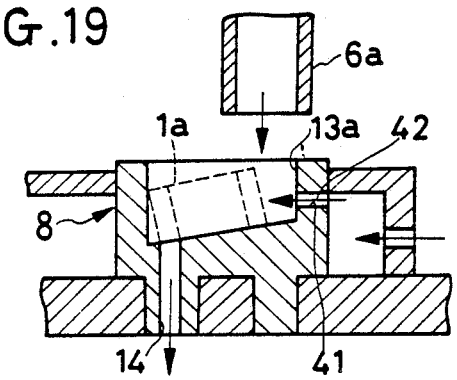
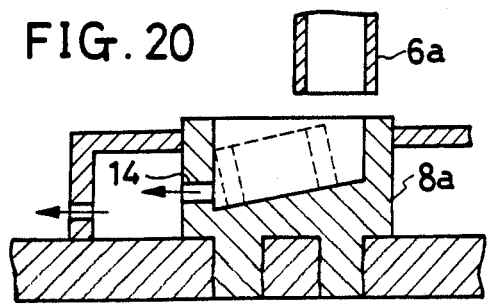

1

CHIP MOUNTING APPARATUS

BACKGROUND OF THE INVENTION

Our invention relates to an apparatus for use in simultaneously mounting a set of chips, by which we mean small electronic circuit components having no leads, on a printed circuit board (PCB). The chip mounting apparatus of our invention particularly features suction head means well adapted for mounting different sets of chips in different positions on different PCBs.

Japanese Unexamined Patent Publication No. 59-152698, laid open Aug. 31, 1984, represents an example of known chip mounting apparatus employing suction heads. Usually, in apparatus of this type, the suction heads are used in combination with a template on which a set of chips are prearranged in a desired pattern in which they are to be mounted on a PCB. The suction heads are brought into contact with the respective chips on the template. Attached to the suction heads by a partial vacuum created therein, the chips are thereby simultaneously transferred from the template to, and deposited on, the PCB.

We object to the known chip mounting apparatus because of the lack of adaptability for different arrangements of chips on different PCBs. The prior art apparatus has required the use of a different suction head assembly and a different template for each different chip arrangement and, in some instances, for each different shape or size of chips. The provision of completely different suction head assemblies and different templates for numerous possible chip arrangements is, of course, undesirable by reasons of the great expenses involved, of the large spaces required for holding them in stock, and of the time and labor needed for each change from one to another.

SUMMARY OF THE INVENTION

We have hereby invented a novel chip mounting apparatus that is readily and inexpensively adaptable for a plurality or multiplicity of different chip arrangements on PCBs, as well as for different shapes or sizes of chips to be mounted.

Briefly, the chip mounting apparatus of our invention may be summarized as comprising template means for holding a set of chips in an arrangement corresponding to a desired arrangement of the chips on a PCB, and suction head means for transferring the set of chips from the template means to the PCB. The suction head means comprises a set of suction head assemblies, provided one for each chip on the template means, and a planar head carrier having a plurality or multiplicity of mounting holes formed therein. The set of suction head assemblies may be removably mounted to the head carrier by engagement in any selected ones of the mounting holes in the head carrier. Therefore, for each different chip arrangement, only the positions of the suction head assemblies may be varied on the head carrier. Also, only the suction head assemblies may be changed from one type to another for handling different shapes or sizes of chips.

The above and other features and advantages of our invention and the manner of realizing them will become more apparent, and the invention itself will best be understood, from a study of the following description and appended claims, with reference had to the attached drawings showing some preferred embodiments of our invention.

BRIEF DESCRIPTION OF THE DRAWINGS

FIG. 5 is a top plan of a positioning vessel of the template means of FIGS. 1 and 2

FIG. 6 is a top plan of another type of positioning vessel of the template means;

FIG. 7 is a top plan of still another type of positioning vessel of the template means;

FIG. 8 is a section through the positioning vessel of FIG. 5, taken along the line VIII—VIII therein;

FIG. 9 is a section through the positioning vessel of FIG. 6, taken along the line IX—IX therein;

FIG. 10 is a section through the positioning vessel of FIG. 7, taken along the line X—X therein;

FIG. 11 is a perspective view of one of the head holders included in the suction head means of FIGS. 2 and 3;

FIG. 17 is a view similar to FIG. 8 but showing a different type of positioning vessel;

FIG. 18 is also a view similar to FIG. 8 but showing still another different type of positioning vessel;

FIG. 19 is a vertical section, taken along the same plane as in FIG. 2, through a modified positioning vessel;

FIG. 20 is a view similar to FIG. 19 but showing another modified positioing vessel;

DESCRIPTION OF THE PREFERRED EMBODIMENTS

Figure 1:
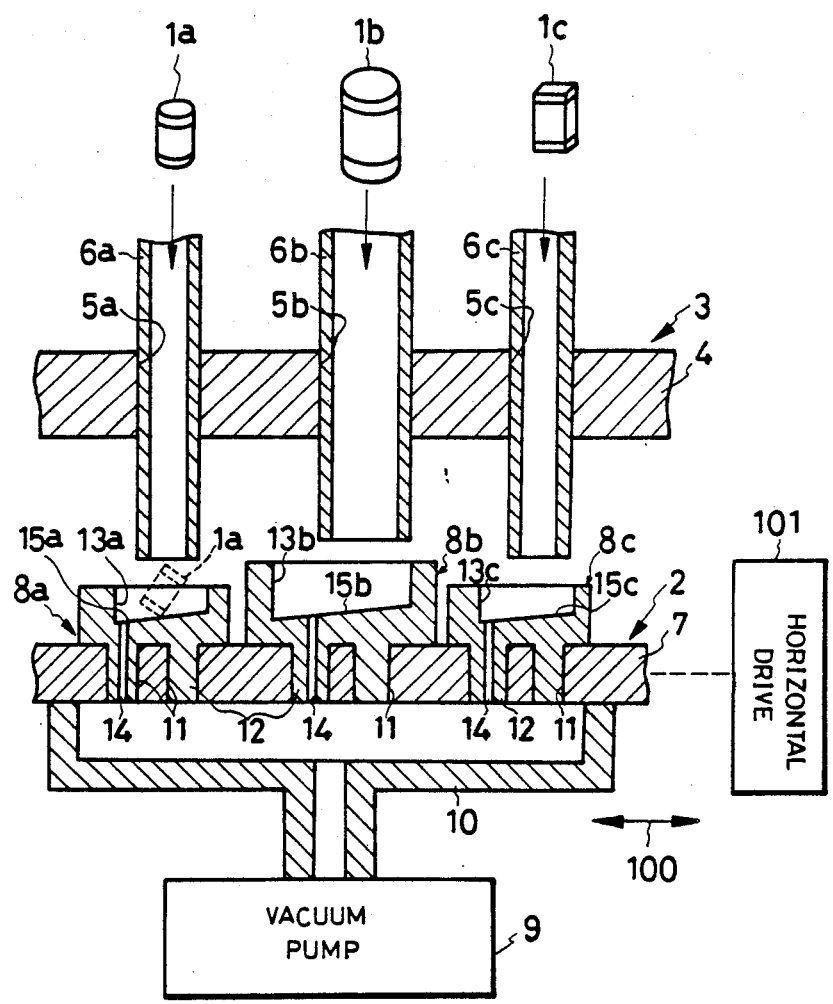
FIG. 1 is a vertical section through chip supply means and template means forming parts of the chip mounting apparatus constructed in accordance with the novel concepts of our invention.

We will now describe the chip mounting apparatus of our invention in detail as adapted for handling chips of three representative shapes and sizes shown at 1a, 1b and 1c in FIG. 1. The first chip 1a is a capacitor of cylindrical shape. The second chip 1b is also a cylindrical capacitor but is larger in size then the first chip 1a. The third chip 1c is a laminated capacitor of rectangular shape.

FIG. 1 shows the chips 1a, 1b and 1c together with chip supply means 3 and template means 2. The chips are to be chuted down onto the template means 2. Thus the chip supply means comprises a suitable number of chutes such as shown at 6a, 6b and 6c extending vertically through holes 5a, 5b and 5c in a support plate 4. It will be noted that the chutes extend downwardly of the support plate 4 to varying degrees according to the varying sizes of chips to be chuted.

The template means 2 comprises a template 7 disposed horizontally, and any required number of open top positioning vessels, such as shown at 8a, 8b and 8c, removably mounted on the template. The three representative positioning vessels 8a, 8b and 8c are disposed under the three representative chutes 6a, 6b and 6c, respectively. The template means 2 is intended for prearranging the chips according to their desired arrangement on a PCB shown at 26 in FIGS. 3 and 4. The provision of different template means for different arrangements of chips on different PCBs would be uneconomical and impractical. In order to avoid this, the positioning vessels are made readily removable from the template 7, and the template has a multiplicity of mounting holes 11 formed vertically therethrough in an array. The positioning vessels of the three representative types 8a, 8b and 8c may be mounted in desired positions on the template by having their depending mounting legs 12 engaged in required ones of the mounting holes 11 according to each desired arrangement of the chips on the PCB and to the kinds of the chips.

As illustrated in top plan in FIGS. 5–7 and in vertical sections in FIGS. 8–10, the positioning vessels 8a, 8b and 8c define open top spaces 13a, 13b and 13c of different shapes for receiving and positioning the three different types of chips 1a, 1b and 1c, respectively. The distances H between the tops of the template 7 and the lowest parts of the spaces 13a, 13b and 13c are all approximately the same. However, the vessels 8a, 8b and 8c have different heights Ha, Hb and Hc.

As will be understood by referring back to FIG. 1, the vertical positions of the bottom ends of the chutes 6a, 6b and 6c differ according to the heights of the associated vessels 8a, 8b and 8c. The bottom ends of the chutes should be spaced from the associated vessels only such a distance as to prevent the chuted chips from flying away from the spaces 13a, 13b and 13c.

FIG. 1 also indicates that the bottoms 15a, 15b and 15c of the vessel spaces 13a, 13b and 13c generally slant downwardly as they extend from the right hand end to the left hand ends of the vessels as viewed in this figure. Each positioning vessel has a suction hole 14 extending vertically through one of its mounting legs 12. Each suction hole 14 is open at its top end to the associated vessel space 13a, 13b or 13c at a point adjacent its left hand end wall. All the suction holes 14 are open at their bottom ends to a hermetically sealed space within an enclosure 10 communicating with a vacuum pump unit 9. Therefore, chuted into the vessel spaces 13a, 13b and 13c, the chips 1a, 1b and 1c will slide down the slanting bottoms 15a, 15b and 15c and will be retained at their left hand ends by suction, as seen in FIG. 2.

Figure 2:
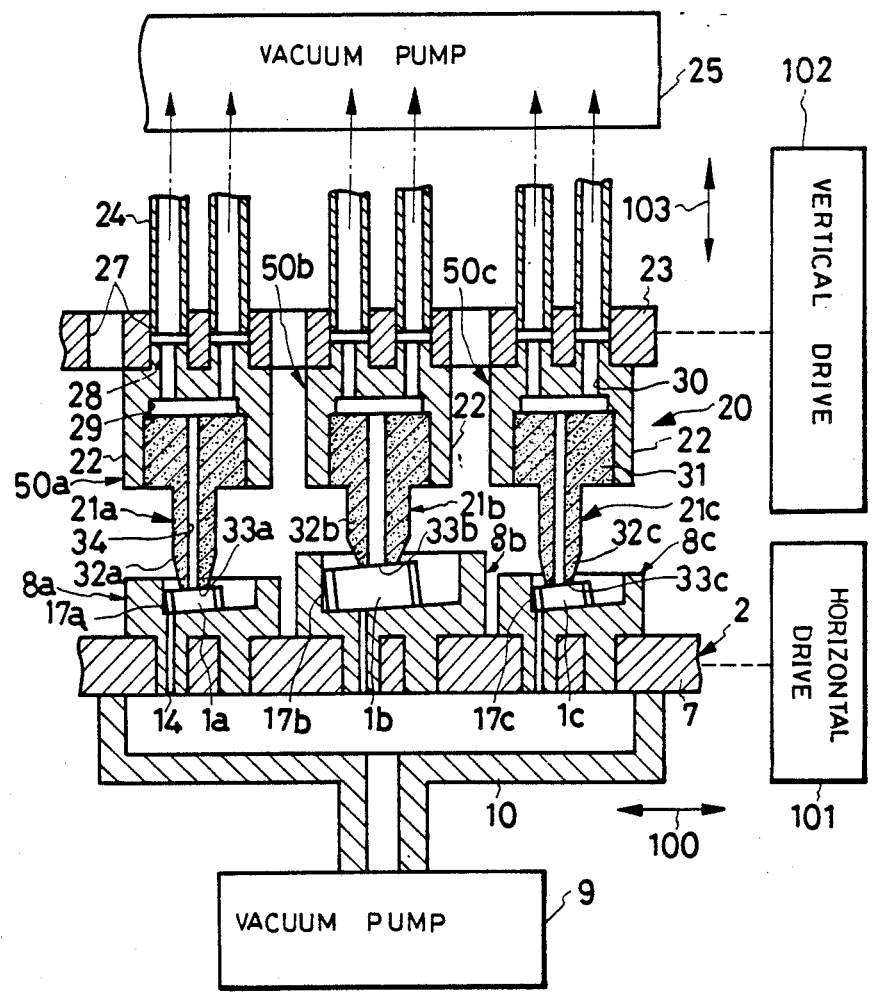
FIG. 2 is a vertical section through suction head means also included in the chip mounting apparatus, the suction head means being shown together with the template means of FIG. 1 with a set of chips loaded thereon.

FIG. 2 shows the chips pneumatically retained in position in a recumbent attitude. The chips are, however, chuted into the positioning vessels 8a, 8b and 8c in an upstanding attitude. In order to ensure that the chips gain the recumbent attitude when chuted into the positioning vessels, the chutes 6a, 6b and 6c have at least their bottom ends displaced toward the right hand ends, as seen in FIG. 1, of the vessel spaces 13a, 13b and 13c. The chips when chuted into the positioning vessels will fall by having their bottom ends pneumatically drawn toward the suction holes 14. Additionally, as required, vibration may be imparted to the positioning vessels in order to cause the chips to infallibly gain the recumbent position therein.

As viewed cross-sectionally as in FIGS. 8, 9 and 10, the vessel spaces 13a, 13b and 13c are shaped and sized to conform to the shapes and sizes of the chips 1a, 1b and 1c to be received therein. The first vessel space 13a is of generally U shaped cross section and has a semicircular bottom 15a to conform to the relatively small size cylindrical chip 1a. The second vessel space 13b is also U shaped but larger in size then the first vessel space 13a to conform to the larger size cylindrical chip 1b. The third vessel space 13c has a flat bottom 15c to conform to the rectangular chip 1c. A pair of slanting side surfaces 16a and 16b on both sides of the flat bottom 15c are intended to cause the chip 1c to slide down to the flat bottom, instead of standing edgewise within the vessel.

The left hand end surfaces 17a, 17b and 17c, FIGS. 5–7, of the vessel spaces 13a, 13b and 13c serve as reference surfaces in the x-axis direction of the xy-plane on which the chips are to be arranged. Seen at 101 in FIGS. 1 and 2 is a horizontal drive mechanism of any known or suitable construction for moving the template means 2 back and forth in the horizontal direction indicated by the double headed arrow 100.

Figure 3:
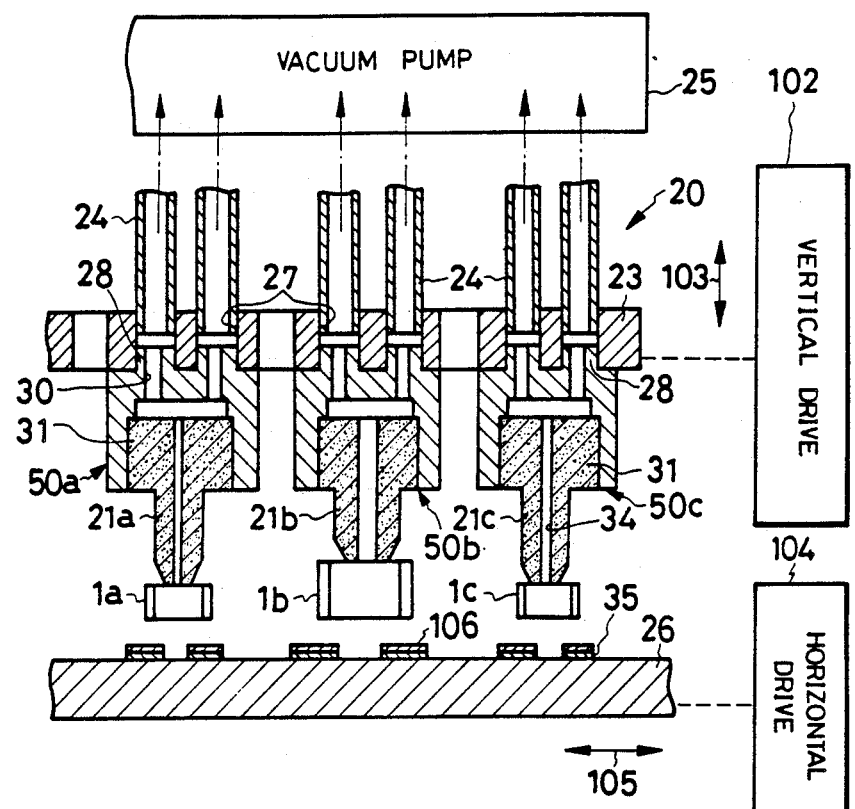
FIG. 3 is a vertical section through the suction head means of FIG. 2 shown together with a PCB on which the chips are to be mounted.

The reference numeral 20 in FIGS. 2 and 3 denotes suction head means of improved construction for transferring the prearranged chips 1a, 1b and 1c from the template means 2 to the PCB 26. The suction head means 20 comprises a set of suction heads such as shown at 21a, 21b and 21c. These three suction heads are intended for carrying the three representative chips 1a, 1b and 1c away from within the positioning vessels 8a, 8b and 8c, respectively.

The suction heads 21a, 21b and 21c are mounted to the underside of a common planar head carrier 23 via respective head holders 22. The combinations of the suction heads 21a, 21b and 21c and the head holders 22 constitute suction head assemblies 50a, 50b and 50c. A pair of flexible suction conduits 24 communicates each suction head with a vacuum pump unit 25. The head carrier 23 is coupled to a vertical drive mechanism 102 whereby the complete set of suction heads are jointly moved up and down with respect to the template means 2, as indicated by the double headed arrow 103.

Figure 15:
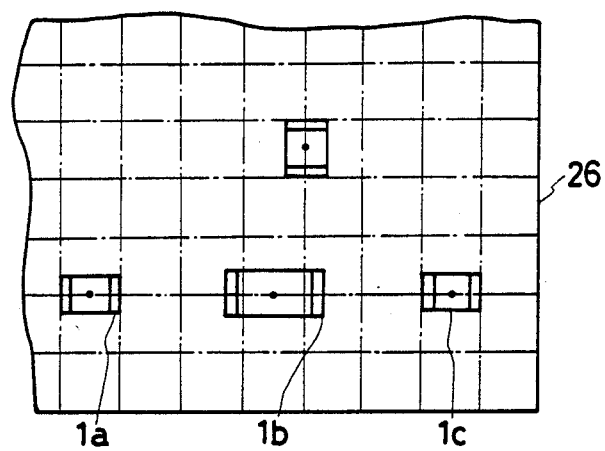
FIG. 15 is a fragmentary plan view explanatory of an arrangement of chips on a PCB.

The three respresentative chips 1a, 1b and 1c under consideration in this embodiment are to be arranged on the PCB 26 as depicted in FIG. 15. However, since the arrangement of chips to be handled by the apparatus is subject to change, the suction head means 20 is constructed in accordance with our invention to readily adapt itself to such variations in chip arrangement.

Figure 16:
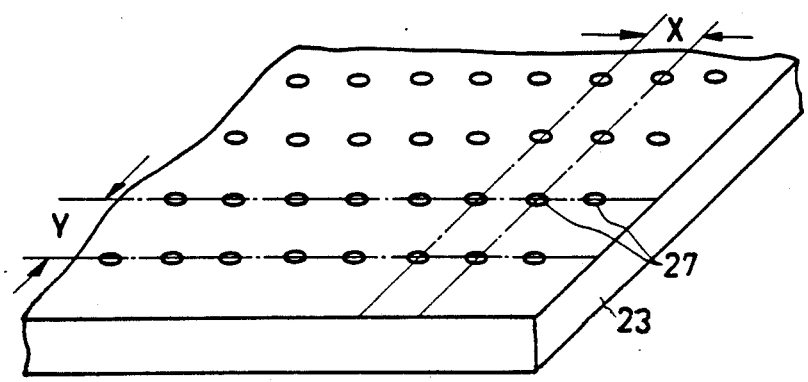
FIG. 16 is an enlarged, fragmentary plan view of the head carrier included in the suction head means of FIGS. 2 and 3.

As illustrated in FIG. 16, the head carrier 23 of the suction head means 20 takes the form of a generally rectangular plate of metal having a multiplicity of perforations or mounting holes 7 extending therethrough and arranged in columns and rows. The center-to-center distances or pitch X of the mounting holes 27 in the x-axis direction and the pitch Y of the mounting holes in the y-axis direction are set equal to, or at an integral submultiple of, the expected minimum center-to-center distance of the chips arranged variously on various PBCs.

FIG. 11 shows that each head holder 22 is formed to include a pair of upstanding mounting pins 28 each having a suction hole 30 extending therethrough. The suction heads 21a, 21b and 21c are mounted to the head carrier 23 as the mounting pins 28 of the head holders 22 are engaged in desired ones of the mounting holes 27 in the head carrier. The flexible suction conduits 24 are also engaged in the same mounting holes for communicating the suction heads with the vacuum pump unit 25 via the suction holes 30.

As will be understood by referring again to FIG. 15, the chips to be handled by the apparatus may be arranged in any positions on the horizontal and vertical lines drawn in this figure, or at the crossing points of such lines. The suction heads with the head holders may be mounted in corresponding positions on the head carrier 23 for placing the chips in the required positions on the PCB 26.

Each head holder 22 has a downwardly open recess 29, FIG. 2, in direct communication with the suction holes 30 in the mounting pins 28. The suction heads 21a, 21b and 21c have their increased diameter base portions 31 closely engaged in the recesses 29 in the head holders 22. The head holders must hold the suction heads against displacement or excessive deformation in the face of shocks or strains that may be exerted thereon during operation. Acrylonitrile-butadiene-styrene copolar, known also as the ABS resin, is a preferred material of the head holders by reason of its dimensional stability over a wide temperature range. The suction heads themselves may be molded from elastomeric material in order to avoid damage to the chips and to take up chip tolerances. Little or no displacement of such elastic suction heads with respect to the template means 2 and the PCB 26 will take place as their enlarged base portions 31 are pressfitted in the recesses 29 in the head holders 22.

The base portions 31 of all the suction heads 21a, 21b and 21c are of the same shape and size. However, the reduced diameter head portions 32a, l 32b and 32c, extending downwardly from the base portions 31, of the suction heads vary in shape and size to suit the shapes and sizes of the three different types of chips 1a, 1b and 1c to be carried. The base portions and head portions of the suction heads have suction holes 34 extending therethrough. These suction holes communicate with the flexible suction conduits 24 via the suction holes 30 in the head holders 22.

Figures 12, 13, 14:
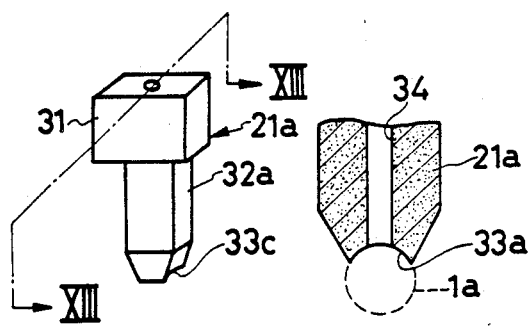
FIG. 12 is a perspective view of one of the suction heads included in the suction head means of FIGS. 2 and 3.
FIG. 13 is an enlarged fragmentary section through the suction head of FIG. 12, taken along the line XIII—XIII therein.
FIG. 14 is a view similar to FIG. 13 but showing another suction head included in the suction head means of FIGS. 2 and 3.

FIGS. 12 and 13 are detailed illustrations of the first suction head 21a comprising the base portion 31 and the head portion 32a. The end face 33a of the head portion 32a is shaped into an arcuate cross section for close contact with the smaller size cylindrical chip 1a. The end face 33b, FIG. 2, of the head portion 32b of the second suction head 21b is of similar shape but is larger in size for close contact with the larger size cylindrical chip 1b. Further, as illustrated in FIG. 14, the end face 33c of the third suction head 21c is made flat for close contact with the rectangular chip 1c.

OPERATION

For mounting the chips on the PCB 26 by the apparatus of the foregoing construction, the template means 2 may be moved by the horizontal drive mechanism 101 to a position under the chip supply means 3, as illustrated in FIG. 1. The template means 2 should be so positioned under the supply means 3 that the chip exit ends of the chutes 6a, 6b and 6c are offset toward the right hand ends, as viewed in FIG. 1, of the open-top spaces 13a, 13b and 13c defined by the positioning vessels 8a, 8b and 8c.

Then, with the vacuum pump unit 9 set into operation, the chips 1a, 1b and 1c may be dropped into the chutes 6a, 6b and 6c, respectively, either simultaneously or successively. The chips will fall down the chutes into the positioning vessels 8a, 8b and 8c.

On hitting the slanting bottoms 15a, 15b and 15c of the positioning vessels 8a, l 8b and 8c, the chips will readily fall into the desired recumbent attitude and will be properly positioned in abutment against the left hand end faces 17a, 17b and 17c of the vessel spaces as suction is exerted on the chips through the holes 14 in the vessel bottoms. Thus the chips will be positioned in the x-axis direction in the xy-plane. The chips will also be positioned in the y-axis direction as the more or less rounded bottoms, as seen cross-sectionally as in FIGS. 8–10, of the vessel spaces 13a, 13b and 13c guide the chips to the central position thereon in the transverse direction of the vessels.

Then the template means 2 with the chips 1a, 1b and 1c loaded thereon may be moved away from under the chip supply means 3 to a position under the suction head means 20 by the horizontal drive mechanism 101.

Then the vertical drive mechanism 102 may be set in operation for descending the suction head means 20. It is understood that the suction heads 21a, 21b and 21c are mounted in such positions on the head carrier 23 as to correspond to the positions of the positioning vessels 8a, 8b and 8c on the template 7 and, in consequence, to the desired positions of the chips 1a, 1b and 1c on the PCB 26. The suction head means 20 may be lowered until the end faces 33a, 33b and 33c of the suction heads 21a, 21b and 21c become pressed against the chips 1a, 1b and 1c which are positioned within the open-top vessels 8a, 8b and 8c. The suction heads will come into firm contact with the chips by virtue of their elasticity, although it is not an absolute requirement that the suction heads contact the chips at this time.

Then the vacuum pump unit 9 may be set out of operation, and the other vacuum pump unit 25 may be set into operation for causing the suction heads 21a, 21b and 21c to exert suction on the chips 1a, 1b and 1c. Thus, released by the positioning vessels 8a, 8b and 8c, the chips will attach to the suction heads 21a, 21b and 21c.

Then the suction head means 20 may be moved up by the vertical drive mechanism 102 thereby lifting the chips from within the positioning vessels. Then the template means 2 may be moved away from under the suction head means 20 by the horizontal drive mechanism 101. Then, as illustrated in FIG. 3, the PCB 26 may be moved to a position under the raised suction head means 20 by the horizontal drive mechanism 104. The suction head means 20, with the chips 1a, 1b and 1c carried by the suction heads 21a, 21b and 21c, and the PCB 26 may be conventionally positioned with respect to each other in both x- and y-axes directions in the xy-plane on which the chips are to be arranged.

Figure 4:
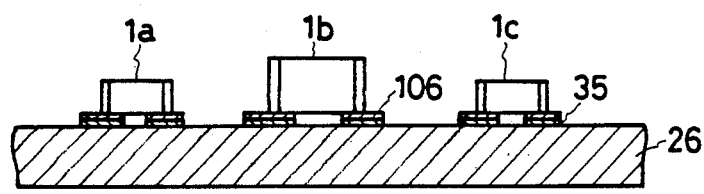
FIG. 4 is a section through the PCB of FIG. 3 shown together with the chips mounted thereon.

Then the suction head means 20 may be moved down by the vertical drive mechanism 102 thereby pressing the chips 1a, 1b and 1c against adhesive layers 106, FIG. 4, of solder paste or the like on the conductive pattern 35 on the PCB 26. Since the bottoms of the vessel spaces 13a, 13b and 13c are approximately on the same level as shown in FIG. 2, the chips 1a, 1b and 1c can all be pressed simultaneously against the adhesive layers 106 on the flat PCB 26. Possibly, the undersides of the chips 1a, 1b and 1c being carried by the suction heads 21a, 21b and 21c may not be on the same level. But even then the suction heads, being of elastic material, will properly press the chips against the adhesive layers.

Then, with the vacuum pump unit 25 set out of operation, the suction head means 20 may be raised away from the PCB 26 by the vertical drive mechanism 102, leaving the chips on the PCB. The PCB 26 with the chips deposited thereon may be carried away from under the suction head means 20 by the horizontal drive mechanism 104. Then the solder paste 106 may be heated for soldering the chips to the conductive patterns 35 on the PCB 26.

The above described embodiment of our invention gains the following advantages:

1. The suction head means 20 is readily adaptable for mounting chips in different positions on different PCBs as the arrangement of the suction heads is varied on the planar perforated head carrier 23.

2. The positions of the suction heads on the head carrier can meet an infinite variety of chip patterns on PCBs as a multiplicity of mounting holes are formed in an array in the head carrier to provide numerous possible head positions.

3. The end faces 33a, 33b and 33c of the suction heads are shaped and sized to suit the different types of chips to be handled, and the bottoms 15a, 15b and 15c of the vessel spaces 13a, 13b and 13c are disposed substantially on the same level, so that the chips can be simultaneously attached to the suction heads and simultaneously deposited on the PCB.

4. The depths of the vessel spaces 13a, 13b and 13c are varied to suit the heights of the chips 1a, 1b and 1c to be received therein, so that a minimal upward displacement of the suction heads 21a, 21b and 21c is required for lifting the chips out of the positioning vessels.

5. The chutes 6a, 6b and 6c have their exit ends held approximately the same distance from the tops of the positioning vessels 8a, 8b and 8c of varying heights, precluding the possibility of the chips jumping out through the gaps between the chutes and the vessels.

6. The chutes have their exit ends disposed off the centers of the vessel spaces 13a, 13b and 13c, so that the chips fall into the required recumbent position on being chuted into the vessel spaces.

7. The placement of the suction hole 14 adjacent one end of each positioning vessel contributes to the infallible falling of the chuted chips into the recumbent position and to the movement of the chips into abutment against the end walls 17a, 17b and 17c of the positioning vessels.

8. The slanting bottoms 15a, 15b and 15c of the positioning vessels also assures the falling of the chuted chips in the required direction.

9. The vessel bottoms 15a, 15b and 15c are cross sectionally shaped to position the chips at the centers of the vessel spaces 13a, 13b and 13c in their transverse direction.

10. The arrangement of the positioning vessels 8a, 8b and 8c is readily variable on the template 7 for adaptation to various arrangements of chips on PCBs.

11. The suction heads 21a, 21b and 21c, although of elastic material, are firmly supported by the head holders 22 of more dimensionally stable material against the likelihood of undesired deformation or displacement when moved into contact with the chips within the positioning vessels.

MODIFICATIONS

The above disclosed apparatus represents but one of many possible embodiments of our invention. A variety of modifications of the representative embodiment are possible within the broad teaching hereof. The following is a list of such modifications.

1. The bottom surface of the positioning vessel 8a, as well as the bottom surfaces of the other positioning vessels 8b and 8c, could be made flat as shown in FIG. 17. In order to be positioned on the flat bottom of the vessel 8a, for example, the chip 1a may be held by the associated suction head so as to be capable of angular displacement in a horizontal plane and may be thereby moved into abutment against two vertical vessel walls at a right angle to each other and to the flat bottom. This positioning method is disclosed in the above referenced Japanese Unexamined Patent Publication No. 59-152698.

2. The bottom surface of the positioning vessel 8c, for receiving the rectangular chip, could be convexed as viewed cross sectionally, as indicated at 40 in FIG. 18, in order to prevent the chip from standing edgewise within the vessel.

3. An air blast hole could be formed horizontally in one end wall of each positioning vessel 8, as shown at 41 in FIG. 19. Compressed air may be forced into the vessel through the blast hole 41, as indicated by the arrow 42, in order to fall the chuted chip and force the same into abutment against the opposite end wall of the vessel. In that case the suction hole 14 may or may not be provided.

4. The suction hole 14 in each positioning vessel could be formed in one of its end walls against which the chip is to be positioned, as illustrated in FIG. 20.

Figure 21:
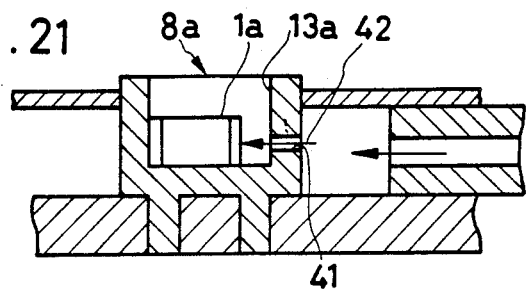
FIG. 21 is also a view similar to FIG. 19 but showing still another modified positioning vessel.

5. Each positioning vessel could be provided with only the blast hole 41, and the suction hole could be dispensed with, as illustrated in FIG. 21.

Figure 22:
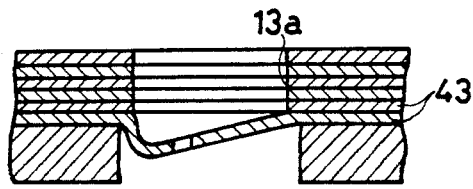
FIG. 22 is also a view similar to FIG. 19 but showing a further modified positioning vessel.

6. Several apertured plates could be stacked to define the positioning spaces 13a, 13b and 13c as in FIG. 22.

7. Each head holder 22 could be mounted to the head carrier 23 via only one mounting pin formed in one piece with the head holder.

8. The suction heads 21a, 21b and 21c could be communicated with the vacuum pump via a common passageway instead of via the separate flexible conduits, provided that means were provided for hermetically closing the mounting holes which were not in use.

What we claim is:

1. An apparatus for mounting a set of chips on a circuit board in any of a plurality of different arrangements, comprising:
   (a) template means for holding a set of chips in an arrangement corresponding to a desired arrangement of the chips on a circuit board;
   (b) suction head means for transferring the set of chips from the template means to the circuit board, the suction head means comprising:
      (1) a planar head carrier having a plurality of mounting holes formed therein;
      (2) a set of suction head assemblies for engagement in selected ones of the mounting holes in the head carrier, which engagement is in any of a plurality of different arrangements according to the desired arrangement of the chips on the circuit board;

each suction head assembly of the suction head means comprising:
  i. a suction head having an end face to which a chip is to be attached by suction; and
  ii. a head holder holding the suction head and having at least one mounting pin for engagement in a selected one of the mounting holes in the head carrier, (3) vacuum means for creating a partial vacuum in the suction head assemblies in order to cause the chips on the template means to be attached thereto by suction; and (c) drive means for relatively moving the template means and the suction head means toward and away from each other.

2. The apparatus of claim 1 wherein the mounting holes in the head carrier of the suction head means are arranged in columns and rows.

3. The apparatus of claim 2 wherein the pitch of the array of mounting holes in each of two orthogonal directions is equal to the expected minimum center-to-center distance of the chips arranged on the circuit board.

4. The apparatus of claim 2 wherein the pitch of the array of mounting holes in each of two orthogonal directions is an integral submultiple of the expected minimum center-to-center distance of the chips arranged on the circuit board.

5. The apparatus of claim 1 wherein each suction head has a suction hole which extends therethrough and which is open to the end face of the suction head, and wherein the mounting pin of each head holder also has a suction hole extending therethrough and communicating with the suction hole in the associated suction head.

6. The apparatus of claim 1 wherein the suction head of each suction head assembly is of elastic material.

7. The apparatus of claim 1 wherein the end face of the suction head of each suction head assembly is shaped and sized for close contact with the particular chip to be handled by the suction head assembly.

8. The apparatus of claim 1 wherein the end faces of the suction heads of the suction head assemblies are positioned at various distances from the head carrier depending upon the sizes of the chips to be attached thereto.

9. The apparatus of claim 1 wherein the end faces of the suction head of at least one of the suction head assemblies is of concave cross section for close contact with a cylindrical chip.

10. The apparatus of claim 1 wherein the end face of the suction head of at least one of the suction head assemblies is flat for close contact with a rectangular shaped chip.

11. The apparatus of claim 1 wherein the template means comprises:
  (a) a template disposed horizontally and having a plurality of mounting holes formed therein; and
  (b) a set of open-top positioning vessels for positioning the chips therein and for engagement in selected ones of the mounting holes in the template, which engagement is in any of a plurality of different arrangements according to the desired arrangement of the chips on the circuit board.

12. The apparatus of claim 11 wherein the template means further comprises second vacuum means for positioning the chips within the positioning vessels by exerting suction on the chips.

13. The apparatus of claim 12 wherein each positioning vessel has a mounting leg and is mounted on the template by having the mounting leg engaged in one of the mounting holes therein.

14. The apparatus of claim 13 wherein each positioning vessel has formed therein a suction hole which is open to the space bounded by the positioning vessel and which extends through the mounting leg, and wherein the second vacuum means comprises:
  (a) a source of vacuum; and
  (b) means for communicating the vacuum source with the suction holes in all the positioning vessels.

15. The apparatus of claim 11 wherein each positioning vessel has an end wall against which the associated chip is to be positioned, and a bottom having a surface slanting downwardly as it extends toward the end wall of the positioning vessel from its opposite end wall.

16. The apparatus of claim 15 wherein each positioning vessel has a suction hole formed in its bottom for positioning the chip by exerting suction thereon.

17. The apparatus of claim 15 wherein each positioning vessel has a suction hole formed in the first recited end wall thereof for positioning the chip by exerting suction thereon.

18. The apparatus of claim 11 wherein each positioning vessel has formed therein an air blast hole for positioning the chip therein by applying compressed air to the chip.

19. The apparatus of claim 11 wherein at least one of the positioning vessels defines a space of U-shaped cross section for positioning a chip of cylindrical shape.

20. The apparatus of claim 11 wherein at least one of the positioning vessels provides a space defined in part by a flat bottom surface and a pair of slanting side surfaces on both sides of the flat bottom surface, for positioning a chip of polygonal cross section.

21. The apparatus of claim 11 wherein at least one of the positioning vessels provides a space defined by a flat bottom surface and a set of side surfaces perpendicular to the bottom surface.

22. The apparatus of claim 11 wherein at least one of the positioning vessels provides a space defined in part by a convex bottom surface, for positioning a chip of polygonal cross section.

23. The apparatus of claim 11 wherein the positioning vessel is formed by a stack of apertured plates.

24. An apparatus of mounting a set of chips on a circuit board in any of a plurality of different arrangement, comprising:
  (a) chip supply means;
  (b) template means for receiving a set of chips from the chip supply means and holding them in an arrangement corresponding to a desired arrangement of the chips on a circuit board, the template means comprising:
    (1) a template disposed horizontally and having an array of mounting holes formed therein; and
    (2) a set of open-top positioning vessels for positioning the chips therein and for engagement in selected ones of the mounting holes in the template, which engagement is in any of a plurality of different arrangements according to the desired arrangement of the chips on the circuit board;

(c) horizontal drive means for reciprocably moving the template means between a first position under the chip supply means and a second position;

(d) suction head means disposed to overlie the template means when the latter is in the second position, and acting to transfer the set of chips from the template means to the circuit board, the suction head means comprising:
  (1) a planar head carrier disposed horizontally and having an array of mounting holes formed therein;
  (2) a set of suction head assemblies mounted to the underside of the head carrier for engagement in selected ones of the mounting holes in the head carrier, which engagement is in any of a plurality of different arrangements according to the desired arrangement of the chips on the circuit board; and
  (3) vacuum means for creating a partial vacuum in the suction head assemblies; and (e) vertical drive means for moving the suction head means toward the template means when the latter is in the second position, in order to cause the chips on the template means to be attached to the respective suction head assemblies by suction, and for moving the suction head means away from the template means together with the chips attached to the suction head assemblies.

25. The apparatus of claim 24 wherein the chip supply means comprises a plurality of chutes having chip exit ends held opposite the respective open-top positioning vessels of the template means, the chip exit ends of the chutes being disposed off the geometrical centers of the positioning vessels in a horizontal plane.

26. The apparatus of claim 24 wherein at least two of the chips positioned on the template means have different heights, and wherein those two of the suction head assemblies which are associated with the two chips of different heights have different vertical dimensions under the head carrier, the sum of the height of one of the two chips and the vertical dimension of the suction head assembly associated therewith being approximately equal to the sum of the height of the other of the two chips and the vertical dimension of the suction head assembly associated therewith.

* * * * *

UNITED STATES PATENT AND TRADEMARK OFFICE
CERTIFICATE OF CORRECTION

PATENT NO. : 4,914,809
DATED : April 10, 1990
INVENTOR(S) : Kikuku Fukai et al

It is certified that error appears in the above-identified patent and that said Letters Patent is hereby corrected as shown below:

On the title page, the Attorney, Agent or Firm should read
--Woodcock, Washburn, Kurtz, Mackiewicz & Norris--.

Col. 4, line 14 "1 1b" should be --1b--.

Col. 5, line 44, "1 32b" should be --32b--.

Signed and Sealed this

Twenty-fifth Day of August, 1992

*Attest:*

DOUGLAS B. COMER

*Attesting Officer*　　*Acting Commissioner of Patents and Trademarks*